United States Patent
Masumoto (10) Patent No.: US 10,329,689 B2
(45) Date of Patent: Jun. 25, 2019

(54) SILICON CARBIDE EPITAXIAL WAFER AND PROCESS FOR PRODUCING SAME

(71) Applicant: NATIONAL INSTITUTE OF ADVANCED INDUSTRIAL SCIENCE AND TECHNOLOGY, Tokyo (JP)

(72) Inventor: Keiko Masumoto, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/296,078

(22) Filed: Oct. 18, 2016

(65) Prior Publication Data
US 2017/0037538 A1    Feb. 9, 2017

Related U.S. Application Data (63) Continuation of application No. PCT/JP2015/061713, filed on Apr. 16, 2015.

(30) Foreign Application Priority Data

Apr. 18, 2014    (JP) ................. 2014-086346

(51) Int. Cl.
*H01L 21/02*    (2006.01)
*C30B 25/18*    (2006.01)
(Continued)

(52) U.S. Cl.
CPC .......... *C30B 25/186* (2013.01); *C23C 16/325* (2013.01); *C30B 25/165* (2013.01);
(Continued)

(58) Field of Classification Search
CPC ....... C23C 16/325; C30B 25/02; C30B 25/18; H01L 21/02378; H01L 21/02524;
(Continued)

(56) References Cited

U.S. PATENT DOCUMENTS 5,200,022 A * 4/1993 Kong ................. C30B 25/02
117/95
6,097,039 A * 8/2000 Peters .................. H01L 29/045
257/628
(Continued)

FOREIGN PATENT DOCUMENTS

JP    2005-311348 A    11/2005
JP    2005-324994        11/2005
(Continued)

OTHER PUBLICATIONS

Danno et al., Impacts of growth parameters on deep levels in n-type 4H-13 SiC, J. Appl. [[Sci.]] *Physics*, 101:053709 (2007).
(Continued)

*Primary Examiner* — Megha M Gaitonde
(74) *Attorney, Agent, or Firm* — Marshall, Gerstein & Borun LLP (57) ABSTRACT

A subject of present invention is to enable reducing, even in growth at a high C/Si ratio, contamination by different polytypes with respect to a silicon carbide epitaxial wafer having a low off-angle, and to provide the silicon carbide epitaxial wafer which enables forming a reliable high voltage silicon carbide semiconductor element.
The silicon carbide epitaxial wafer of the present invention is a silicon carbide epitaxial wafer comprising an epitaxially grown layer disposed on a silicon carbide substrate having an α-type crystal structure and an off-angle tilted at an angle of more than 0° and less than 4° from a (0001) Si plane or a (000-1) C plane, wherein a region of a step bunching
(Continued)

including five to ten bunched steps of 1 nm in height occupies 90% or more of the surface of the silicon carbide substrate.

20 Claims, 6 Drawing Sheets

(51) Int. Cl.
    *C30B 29/36*     (2006.01)
    *C23C 16/32*     (2006.01)
    *C30B 25/16*     (2006.01)
    *C30B 25/20*     (2006.01)
    *C30B 33/10*     (2006.01)
    *H01L 21/306*     (2006.01)
    *H01L 21/324*     (2006.01)
    *H01L 29/04*     (2006.01)
    *H01L 29/16*     (2006.01)
    *H01L 21/3065*     (2006.01)

(52) U.S. Cl.
    CPC ............... *C30B 25/20* (2013.01); *C30B 29/36* (2013.01); *C30B 33/10* (2013.01); *H01L 21/0259* (2013.01); *H01L 21/0262* (2013.01); *H01L 21/02378* (2013.01); *H01L 21/02433* (2013.01); *H01L 21/02529* (2013.01); *H01L 21/02658* (2013.01); *H01L 21/3065* (2013.01); *H01L 21/30604* (2013.01); *H01L 21/30625* (2013.01); *H01L 21/324* (2013.01); *H01L 21/3247* (2013.01); *H01L 29/045* (2013.01); *H01L 29/1608* (2013.01); *Y10T 428/24529* (2015.01)

(58) Field of Classification Search
    CPC ............... H01L 21/02433; H01L 21/20; H01L 21/2003; H01L 21/205; H01L 29/045; H01L 29/1608; Y10T 428/24058; Y10T 428/24132; Y10T 428/24355; Y10T 428/24479; Y10T 428/24521; Y10T 428/24537; Y10T 428/2457; Y10T 428/24587; Y10T 428/24612; Y10T 428/24942; Y10T 428/2495; Y10T 428/24967
    USPC ....... 428/105, 114, 141, 156, 161, 163, 167, 428/169, 172, 173, 212, 213, 220
    See application file for complete search history.

(56) References Cited

U.S. PATENT DOCUMENTS

| | | | | |
|---|---|---|---|---|
| 6,165,874 | A * | 12/2000 | Powell | C30B 25/02 257/E21.125 |
| 2004/0237879 | A1* | 12/2004 | Kaneko | C30B 19/04 117/2 |
| 2007/0096109 | A1* | 5/2007 | Seki | C30B 25/02 257/77 |
| 2007/0221119 | A1 | 9/2007 | Kimoto et al. | |
| 2007/0290211 | A1 | 12/2007 | Nakayama et al. | |
| 2009/0230404 | A1* | 9/2009 | Masuda | C23C 16/325 257/77 |

FOREIGN PATENT DOCUMENTS

| | | |
|---|---|---|
| JP | 2008-260650 A | 10/2008 |
| JP | 2009-182240 | 8/2009 |
| JP | 2010-265126 | 11/2010 |

OTHER PUBLICATIONS

International Preliminary Report on Patentability (English translation), International Application No. PCT/JP2015/061713, dated Oct. 18, 2016.
International Search Report, International Application No. PCT/JP2015/061713, dated Jun. 23, 2015.
Kojima et al., 4H-SiC homoepitaxial growth on substrate with vicinal off-angle lower than 1°, ECS J. Solid State Science and Technology, 2(8):N3012-7 (2013).
Masumoto et al., Relationship between growth conditions and stacking fault density in growth of epitaxial layers on 4H-SiC C-face substrates with vicinal off-angle of lower than 1°, Proceedings of the 61st JSAP Spring Meeting, with English Translation, The Japan Society of Applied Physics, pp. 15-214 (Mar. 3, 2014).
Matsunami et al., Step-controlled epitaxial growth of SiC: high quality homoepitaxy, Materials Science and Engineering, R20:125-66 (1997).
Wada et al., Epitaxial growth of 4H-SiC on 4° off-axis (0001) and (000$\bar{1}$) substrates by hot-wall chemical vapor deposition, J. Cryst. Growth, 291:370-4 (2006).
Kimoto et al., Step-controlled epitaxy in semiconductor SiC polytypes, Oyo Butsuri, Japan Society of Applied Physics, 64(7):691-4 (1995).
Masumoto et al., In-situ etching conditions of 4H-SiC Si-face substrates with vicinal off-angle, Extended Abstracts, Japan Society of Applied Physics, pp. 15-230 (2013).
Powell et al., Process-induced morphological defects in epitaxial CVD silicon carbide, Phys. Stat. Sol. (B), 202:529-48 (1997).

* cited by examiner

SILICON CARBIDE EPITAXIAL WAFER AND PROCESS FOR PRODUCING SAME

CROSS-REFERENCE TO RELATED APPLICATION

This is a continuation of International Application PCT/JP2015/061713, filed on Apr. 16, 2015, and designating the U.S., (and claims priority from Japanese Patent Application No. 2014-086346, filed on Apr. 18, 2014), the entire contents of which are incorporated herein by reference.

TECHNICAL FIELD

The present invention relates to a silicon carbide epitaxial wafer having a roughness structure on the boundary between a silicon carbide substrate and an epitaxially grown silicon carbide layer having a flat surface.

BACKGROUND ART

Power semiconductor elements are expected to save energy because they can reduce energy loss during power conversion. Performance improvement in power semiconductor elements have been hitherto achieved by using silicon (Si) semiconductors, but Si semiconductor elements appear to have reached a point of no further performance improvement owing to the limitation of physical properties of Si.

On the other hand, silicon carbide (SiC) has excellent physical properties, for example, an about 10 times higher electric field strength at dielectric breakdown, an about 3 times wider forbidden band, and an about 3 times larger thermal conductivity than those of Si, providing a prospect of further performance improvement in power semiconductor elements, and therefore SiC semiconductors using this material are demanded to spread rapidly.

SiC has many polytypes, and among them, the polytype of 4H is generally used for SiC substrates for SiC semiconductor elements which are expected to be next-generation semiconductor elements for power conversion. In addition, from the view point of using the step-controlled epitaxy, 4H-SiC substrates having an off-angle are regarded as main stream. Forming effectively an epitaxially grown layer on a SiC substrate having a low off-angle of less than 4°, particularly 1° or less is expected to be able to reduce the production cost of SiC semiconductor elements and to control the anisotropicity of properties of SiC semiconductor elements, leading to their effective utilization for various fields in society.

SiC substrates are usually given a predetermined off-angle from the (0001) Si plane or the (000-1) C plane when cut off from a SiC ingot. The cut SiC substrate is surface-processed by, for example, polishing, and then used in the form of an epitaxial wafer having an epitaxially grown layer formed on the surface of the substrate.

In this process, when the epitaxially grown layer is contaminated by a different polytype or contains many carrier-trapping centers, semiconductor elements to be formed on the layer will deteriorate their performance and reliability. In addition, when the epitaxially grown layer captures a large amount of impurity nitrogen, control of nitrogen concentration can be carried out only within the range higher than the concentration of the impurity nitrogen, which narrows the controllable range of nitrogen concentration and makes it difficult to fabricate high voltage semiconductor elements on the layer. In order to fabricate reliable high voltage semiconductor elements, it is indispensable to reduce the contamination of the epitaxially grown layer by different polytypes, the generation of carrier-trapping centers, and the capture of impurity nitrogen.

It is known that a lower off-angle of the SiC substrate tends to cause the contamination of the epitaxially grown layer by different polytypes, and a substrate having an off-angle of 4° is considered main stream as a substrate having an off-angle which can reduce the contamination by different polytypes. It is reported that a raw material gas having an low atom number ratio of carbon atoms to silicon atoms (C/Si ratio) is required to be introduced in order to reduce the contamination by different polytypes when an epitaxially grown layer is formed on a substrate having an off-angle of less than 4°, and particularly 1° or less (Patent document 1, and Non-patent document 1).

However, forming an epitaxially grown layer at a low C/Si ratio causes a problem of increase in carrier-trapping centers and the capture of impurity nitrogen which are due to carbon vacancies (Non-patent document 2, and Non-patent document 3).

PRIOR ART REFERENCES

Patent Document

Patent document 1: JP-A-2008-260650

Non-Patent Documents

Non-patent document 1: ECS Journal of Solid State Science and Technology, Vol. 2, pp. N3012-N3017, 6 Jun. 2013

Non-patent document 2: Journal of Applied Physics, Vol. 101, pp. 053709-1-053709-4, 9 Mar. 2007

Non-patent document 3: Materials Science and Engineering: R, Vol. 20, pp. 125-166, 5 Nov. 1996

DISCLOSURE OF THE INVENTION

Problems to be Solved by the Invention

The present invention aims to solve the above-mentioned problems to achieve the following objects. In other words, an object of the present invention is to enable reducing, even in growth at a high C/Si ratio, contamination by different polytypes with respect to a silicon carbide epitaxial wafer having a low off-angle, and to provide the silicon carbide epitaxial wafer which enables forming a reliable high voltage silicon carbide semiconductor element.

In order to solve the problems, the present inventors have carried out extensive studies and found that creation of step bunching on a pre-growth silicon carbide substrate enables reducing, even in growth at a high C/Si ratio, the contamination by different polytypes. The 4H-SiC substrate having the above-mentioned off-angle usually has a structure which is constituted by steps of 1 nm in height, which is a length of one unit cell in the c-axis direction, and a flat terrace, and the step bunching is referred to as a state in which a plurality of these steps of 1 nm in height are bunched.

Means for Solving the Problems

The present invention is based on the above finding, and means to solve the above subject are as follows.

(1) A silicon carbide epitaxial wafer comprising an epitaxially grown layer disposed on a silicon carbide substrate having an α-type crystal structure and an off-angle tilted at an angle larger than 0° and 10° or less from a (0001) Si plane, wherein a region of a step bunching including five to ten bunched steps of 1 nm in height occupies 90% or more along a cross-section orthogonal to step terraces in the vicinity of a boundary between the surface of the silicon carbide substrate and the epitaxially grown layer.

(2) A silicon carbide epitaxial wafer comprising an epitaxially grown layer disposed on a silicon carbide substrate having an α-type crystal structure and an off-angle tilted at an angle larger than 0° and less than 4° from a (0001) Si plane or a (000-1) C plane, wherein a region of a step bunching including five to ten bunched steps of 1 nm in height occupies 90% or more along a cross-section orthogonal to step terraces in the vicinity of a surface of the silicon carbide substrate.

(3) The silicon carbide epitaxial wafer according to (1) or (2), wherein the surface roughness of the epitaxially grown layer is more than 0 and 0.1 nm or less.

(4) The silicon carbide epitaxial wafer according to any one of (1) to (3), wherein the density of different polytypes is more than 0 and $0.2/cm^2$ or less.

(5) A method for producing a silicon carbide epitaxial wafer, comprising:
a step of preparing a silicon carbide substrate having an α-type crystal structure and an off-angle tilted at an angle of more than 0° and less than 4° from a (0001) Si plane or a (000-1) C plane;
a step of carrying out hydrogen etching for about 40 minutes or more on the surface of the silicon carbide substrate heated to a given temperature in a hydrogen atmosphere, to form a step bunching thereon;
a step of fabricating, under such a condition that a C/Si ratio is 2 or more, an epitaxially grown layer of silicon carbide on the surface of the silicon carbide substrate comprising the step bunching formed thereon; and
a step of planarizing the surface of the formed epitaxially grown layer by carrying out chemical mechanical polishing on the surface, to fabricate a silicon carbide epitaxial wafer.

(6) The method for producing a silicon carbide epitaxial wafer according to (5), wherein the given temperature is from 1,500° C. to 1,800° C.

(7) The method for producing a silicon carbide epitaxial wafer according any one of (5) to (6), wherein in the fabricated silicon carbide epitaxial wafer, a region of a step bunchings including five to ten bunched steps of 1 nm in height occupies 90% or more along a cross-section orthogonal to step terraces in the vicinity of a boundary between the surface of the silicon carbide substrate and the epitaxially grown layer.

Effect of the Invention

The present invention can solve the above-mentioned problems in prior art, and enables reducing, even in growth at an high C/Si ratio, the contamination by different polytypes with respect to silicon carbide substrates having a low off-angle, and can provide a silicon carbide epitaxial wafer enabling formation of a reliable high voltage silicon carbide semiconductor element.

EMBODIMENTS FOR CARRYING OUT THE INVENTION (Silicon Carbide Epitaxial Wafer)

The silicon carbide epitaxial wafer of the present invention is a silicon carbide epitaxial wafer including an epitaxially grown layer disposed on a silicon carbide substrate having an α-type crystal structure and e an off-angle tilted at an angle of more than 0° and less than 4° from a (0001) Si plane or a (000-1) C plane, wherein the region of step bunching including five to ten bunched steps of 1 nm in height occupies 90% or more of the surface of the silicon carbide substrate.

Figure 1:
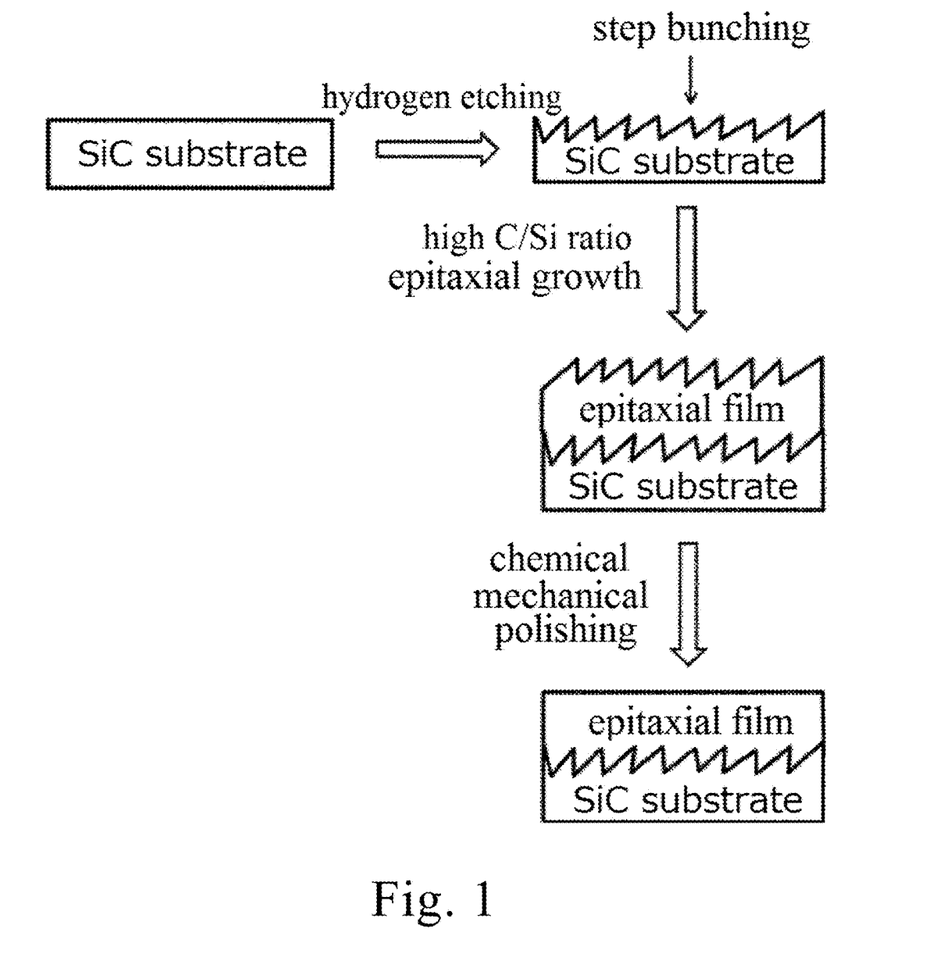
FIG. 1 is an explanatory drawing of a process of the present invention.

FIG. 1 illustrates an explanatory drawing of a process of the present invention. Hydrogen etching is carried out on a silicon carbide substrate to create step bunching, and then epitaxially grown layer is formed under a condition of a high C/Si ratio. After the formation of the epitaxial growth layer, the surface of the epitaxially grown layer is planarized by using chemical mechanical polishing and dry etching.

Determination of whether step bunching have been created or not on the silicon carbide substrate can be carried out by a cross-sectional measurement using SEM (Scanning Electron Microscopy) or TEM (Transmission Electron microscopy) which observes the boundary between the silicon carbide substrate and the epitaxially grown layer of a specimen cut from the silicon carbide epitaxial wafer. The silicon carbide substrate and the epitaxially grown layer exhibit different contrasts in the SEM and TEM measurements, depending on difference in the species and concentration of impurities contained therein, and thus the boundary can be identified. Consequently, the geometry of the surface of the silicon carbide substrate can be observed.

EXAMPLES

Example 1

A silicon carbide substrate having the 4H crystal structure was prepared which was a representative silicon carbide substrate having an α-type crystal structure. This silicon carbide substrate had an off-angle tilted by an angle of 0.9° in the <11-20> direction from the (0001) Si plan.

This silicon carbide substrate was placed in a reactor of a hot-wall CVD apparatus to produce a silicon carbide epitaxial wafer according to Example 1, as will be described below.

<Hydrogen Etching Step>

The pressure in the reactor was maintained to be 6 kPa, with hydrogen gas kept introduced into the reactor at a flow rate of 100 slm, and the silicon carbide substrate was heated to 1,725° C. by radio frequency induction heating. Hydrogen etching was carried out for 40 minutes under this condition to create step bunching on the surface of the silicon carbide substrate.

Although the temperature condition in the hydrogen etching step is not particularly limited and can be appropriately selected depending on a purpose, it is preferably from 1,500° C. to 1,800° C. When the temperature condition is lower than 1,500° C., a longer time may be required for the hydrogen etching step, causing a higher production cost, and when the condition exceeds 1,800° C., it may be difficult to maintain the thermal resistance of the apparatus producing the silicon carbide epitaxial wafer.

<Formation Step by Epitaxial Growth>

Then, silane and propane were introduced into the reactor at flow rates of 50 sccm and 33 sccm, respectively, and an epitaxially grown layer of 10 μm in thickness was formed on the surface of the silicon carbide substrate under such a condition that the C/Si ratio was 2.

<Step of Planarizing Surface of Epitaxial Wafer>

Chemical mechanical polishing was carried out on the surface of the produced epitaxial wafer to planarize the surface.

As described above, the silicon carbide epitaxial wafer according to Example 1 was produced.

An AFM (Atomic Force Microscope) measurement was carried out on the epitaxial wafer fabricated in Example 1.

Figure 2:
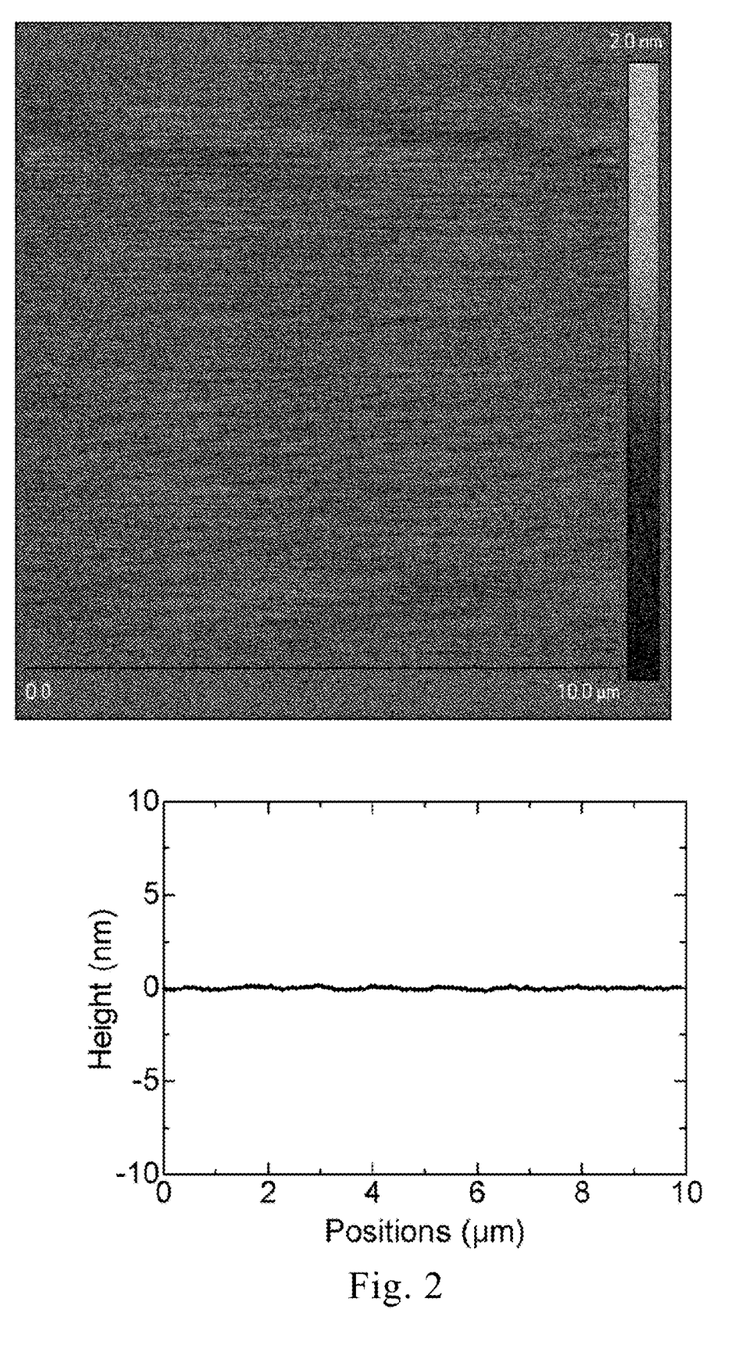
FIG. 2 is an AFM image with a cross-sectional profile of an epitaxial wafer fabricated in Example 1.

FIG. 2 illustrates an AFM image and a cross-sectional profile orthogonal to step terraces, of the epitaxial wafer fabricated in Example 1. The surface roughness of the wafer was 0.08 nm.

Comparative Example 1

Further, a silicon carbide epitaxial wafer according to Comparative example 1 was produced in the same manner as that in Example 1 except that the etching time was changed from 40 minutes to 0 minutes in the hydrogen etching step.

<Calculation of Density of Contamination owing to Different Polytypes>

A measurement of light emission spectra was carried out by PL (Photoluminescence) measurement and contamination density owing to different polytypes was calculated based on the count of faults exhibiting light emission other than light emission owing to the band edge of 4H-SiC and owing to impurities in the silicon carbide substrate. As a result, for the epitaxial wafer fabricated in Example 1, stacking fault density owing to 3C contamination exhibiting light emission from the 3C bulk was $0.2/cm^2$, and no other stacking faults were detected. On the other hands, for the epitaxial wafer fabricated in Comparative example 1, the stacking fault density owing to 3C contamination was $3.1/cm^2$, and no other stacking faults were detected.

<Measurement>

A substrate for observational use was fabricated via the hydrogen etching step under the same condition as that of the hydrogen etching step in each of Example 1 and Comparative example 1.

An AFM measurement was carried out on the substrate for observational use fabricated under the condition of the hydrogen etching step in each of Example 1 and Comparative example 1.

Figure 3:
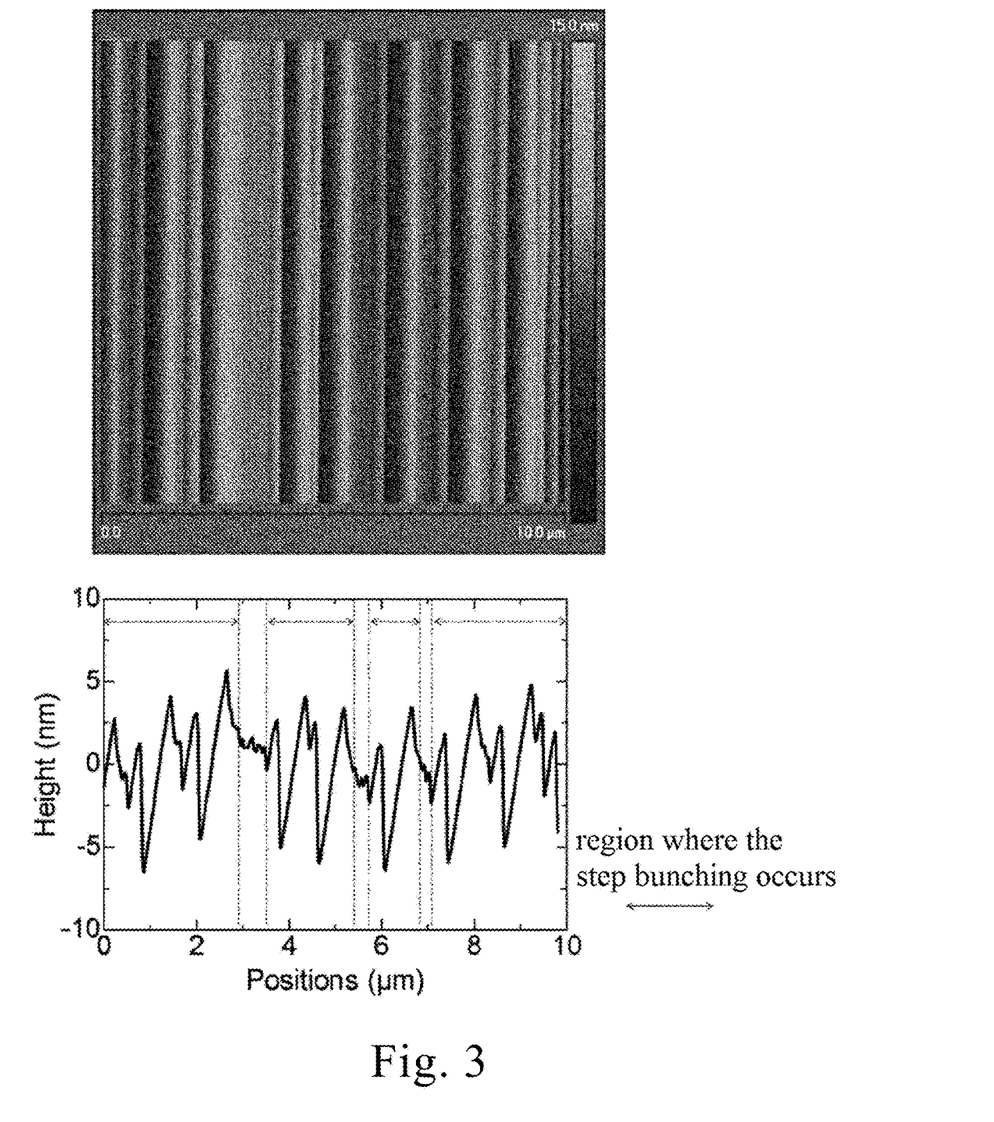
FIG. 3 is an AFM image with a cross-sectional profile orthogonal to step terraces, of a substrate for observational use fabricated under a condition of a hydrogen etching step in Example 1.
Figure 4:
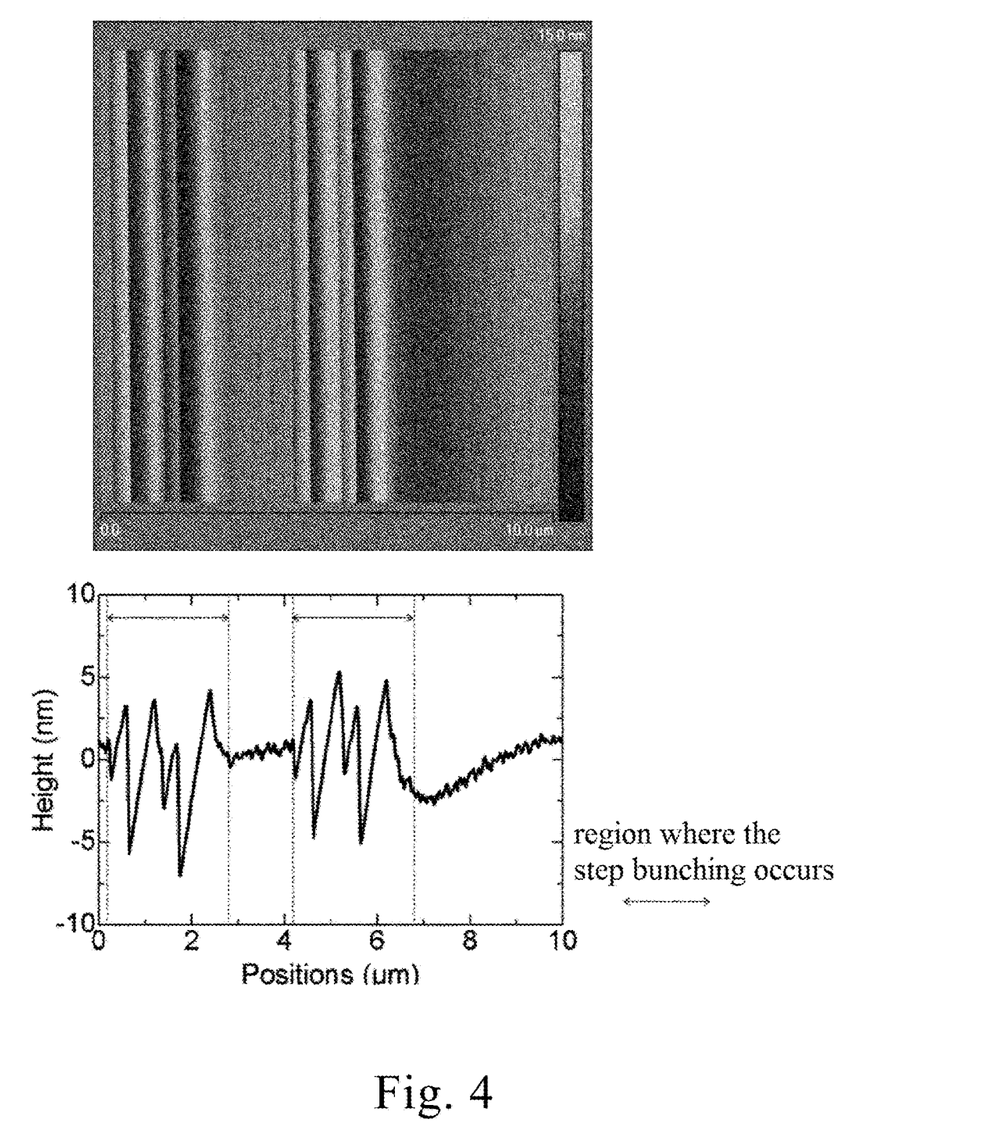
FIG. 4 is an AFM image with a cross-sectional profile orthogonal to step terraces, of a substrate for observational use fabricated under a condition of a hydrogen etching step in Comparative example 1.

FIG. 3 and FIG. 4 show an AFM image with a cross-sectional profile of the substrate for observational use fabricated under the condition of the hydrogen etching step in each of Example 1 and Comparative example 1.

Figure 5:
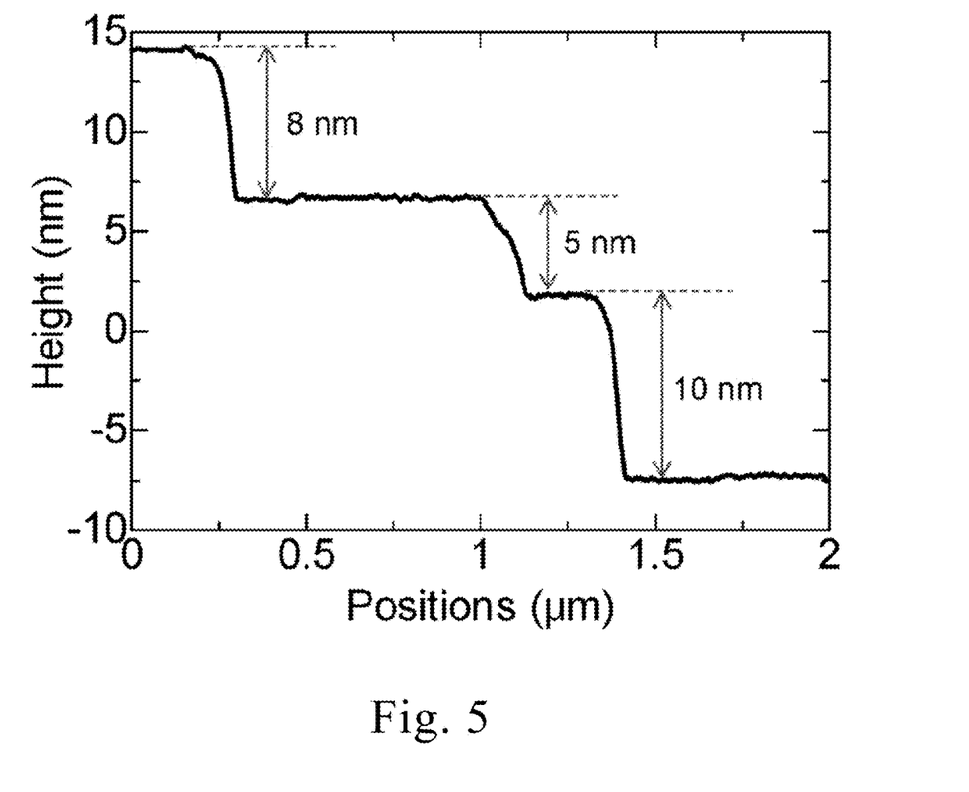
FIG. 5 is a cross-sectional profile orthogonal to step terraces, obtained by the AFM measurement in a region where step bunching occurs.

FIG. 5 shows a cross-sectional profile obtained by the AFM measurement of a region where step bunching occurred. For better understanding of the bunched number of the steps, the (0001) Si plane is taken parallel to the horizontal axis. As can be seen in FIG. 5, step bunching including five to ten bunched steps of 1 nm in height occurred on the surface of the silicon carbide substrate.

<Calculation of Proportion of Region Occupied by Step Bunching in Surface of Silicon Carbide Substrate>

In a cross-section orthogonal to step terraces from −10 nm in altitude (lowest altitude of roughness generated by hydrogen etching) to +10 nm in altitude (highest altitude of roughness generated by hydrogen etching) on the substrate surface, three AFM measurement images of a rectangular area of 10 μm×10 μm parallel to the etched boundary were arbitrarily selected, and the area where step bunching occurred was divided by the total measurement area to obtain the proportion of the region occupied by the step bunching in the surface of the silicon carbide substrate.

As can be seen in FIG. 3, in the vicinity of the surface of the substrate for observational use fabricated on the basis of the condition of the hydrogen etching step in Example 1, a large proportion of the region was occupied by the step bunching including five to ten bunched steps of 1 nm in height. Calculation by the above-mentioned method gave 93% for the proportion of the region occupied by the step bunching in the surface of silicon carbide substrate. On the other hand, the proportion was 44% with respect to the surface of the substrate for observational use fabricated on the basis of the condition of the hydrogen etching step of Comparative example 1. When step bunching of less than 5 nm in height occurred, their area to be excluded was determined to be the value of a width corresponding to a step height of less than 5 nm multiplied by 10 μm which was a value of the depth of the cross-sectional profile orthogonal to step terraces.

This Example was achieved on a surface having an off-angle tilted by an angle of 0.9 degree in the <11-20> direction from the (0001) Si plane, and a smaller tilt angle is more likely to create step bunching, leading to a similar result even for shorter etching time than that in this example. A larger tilt angle is less likely to create step bunching, but a similar result can be obtained by setting a longer etching time than that in this example.

Example 2

Example 2, and Comparative Examples 2 and 3

Silicon carbide epitaxial wafers according to Example 2 and Comparative examples 2 and 3 were produced in the same manner as that in Example 1 except that the hydrogen etching temperature and the hydrogen etching time in the hydrogen etching step in Example 1 were changed to values indicated in Table 1 below.

The proportion of the region occupied by step bunching in the surface of the silicon carbide substrate and the stacking fault density owing to the 3C contamination, measured in the same manner as that in Example 1, were also shown in Table 1 below.

TABLE 1

| Example/Comparative Example | etching temperature (° C.) | etching time (minutes) | proportion of region occupied by step bunching (%) | stacking fault density owing to 3C contamination (/cm²) |
|---|---|---|---|---|
| Example 1 | 1725 | 40 | 93 | 0.2 |
| Example 2 | 1725 | 60 | 95 | 0.2 |
| Comparative Example 1 | 1725 | 0 | 44 | 3.1 |
| Comparative Example 2 | 1725 | 20 | 88 | 0.7 |
| Comparative Example 3 | 1660 | 1 | 0 | 5.9 |

As can be seen in Table 1, when the hydrogen etching step was carried out under such a condition that the region occupied by step bunching was 90% or more of the surface of the silicon carbide substrate, the stacking fault density owing to the 3C contamination was able to be reduced 0.2/cm² or less.

On the other hand, when the hydrogen etching step was carried out under such a condition that the region occupied by step bunching was less than 90% of the surface of the silicon carbide substrate, the stacking fault density owing to the 3C contamination exhibited a value significantly higher than 0.2/cm².

Figure 6:
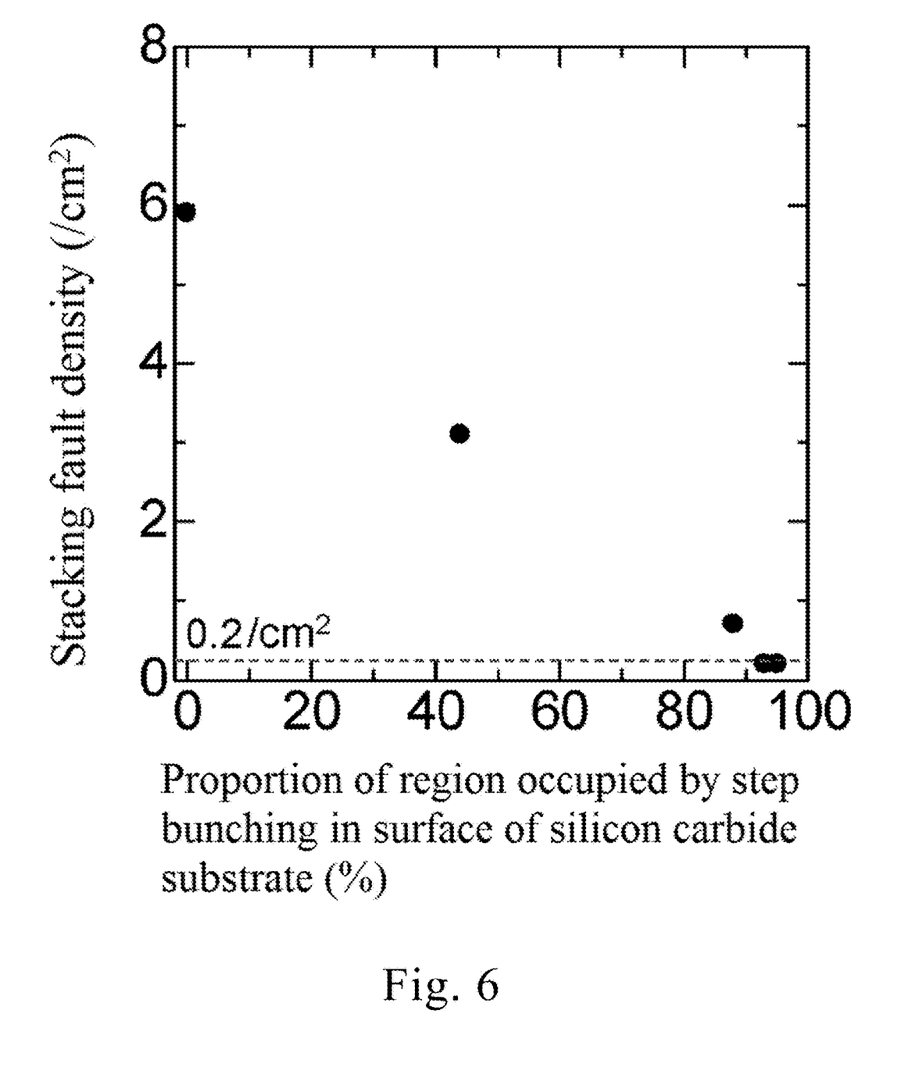
FIG. 6 is a graph showing a relation of the region occupied by step bunching in the surface of the silicon carbide substrates according to Examples 1 and 2 and Comparative examples 1 to 3 with stacking fault density owing to 3C contamination of the substrates.

Now, an explanation is made for a relation of the proportion of the region occupied by step bunching in the surface of the silicon carbide substrate with the stacking fault density owing to the 3C contamination. FIG. 6 shows a graph indicating a relation of the proportion of the region occupied by step bunching in the surface of the silicon carbide substrate with the stacking fault density owing to the 3C contamination, in the silicon carbide epitaxial wafer according to each of Examples 1, 2, and Comparative examples 1 to 3. It was confirmed that the region occupied by step bunching must be 90% or more of the surface of the silicon carbide substrate in order to reduce the stacking fault density owing to the 3C contamination down to 0.2/cm² or less.

The invention claimed is:

1. A silicon carbide epitaxial wafer comprising an epitaxially grown layer disposed on a silicon carbide substrate having an α-type crystal structure and an off-angle tilted at an angle larger than 0° and 1° or less from a (0001) Si plane,
wherein a step bunching region comprising bunched steps of 1 nm unit height for each step and a total step height from 5 nm to 10 nm occupies 90% or more of a surface of the silicon carbide substrate along step terraces of the bunched steps at a boundary between the silicon carbide substrate and the epitaxially grown layer.

2. A silicon carbide epitaxial wafer comprising an epitaxially grown layer disposed on a silicon carbide substrate comprising an α-type crystal structure and an off-angle tilted at an angle larger than 0° and less than 4° from a (0001) Si plane or a (000-1) C plane,
wherein a step bunching region comprising bunched steps of 1 nm unit height for each step and a total step height from 5 nm to 10 nm occupies 90% or more of a surface of the silicon carbide substrate along step terraces of the bunched steps at the surface of the silicon carbide substrate.

3. The silicon carbide epitaxial wafer according to claim 1, wherein a surface roughness of the epitaxially grown layer is more than 0 nm and 0.1 nm or less.

4. The silicon carbide epitaxial wafer according to claim 1, wherein a stacking fault density of a different polytype is more than 0/cm² and 0.2/cm² or less.

5. A method for producing the silicon carbide epitaxial wafer of claim 2, the method comprising:
preparing a silicon carbide substrate having an α-type crystal structure and an off-angle tilted at an angle of more than 0° and less than 4° from a (0001) Si plane or a (000-1) C plane;
forming a region of a step bunching on a surface of the silicon carbide substrate;
fabricating, under such a condition that a C/Si ratio is 2 or more, an epitaxially grown silicon carbide layer on the surface of the silicon carbide substrate comprising the step bunching formed thereon; and
planarizing the surface of the formed epitaxially grown layer by carrying out chemical mechanical polishing on the surface, to fabricate the silicon carbide epitaxial wafer,
wherein in the fabricated silicon carbide epitaxial wafer, the region of the step bunching comprising five to ten bunched steps of 1 nm in height occupies 90% or more in a surface of the silicon carbide substrate along the step terraces of the step bunching of a boundary between the silicon carbide substrate and the epitaxially grown layer.

6. The silicon carbide epitaxial wafer according to claim 2, wherein a surface roughness of the epitaxially grown layer is more than 0 nm and 0.1 nm or less.

7. The silicon carbide epitaxial wafer according to claim 2, wherein a stacking fault density of a different polytype is more than 0/cm² and 0.2/cm² or less.

8. The silicon carbide epitaxial wafer according to claim 6, wherein a stacking fault density of a different polytype is more than 0/cm² and 0.2/cm² or less.

9. The silicon carbide epitaxial wafer according to claim 3, wherein a stacking fault density of a different polytype is more than 0/cm² and 0.2/cm² or less.

10. The silicon carbide epitaxial wafer according to claim 2, wherein the off-angle of the silicon carbide substrate is larger than 0° and less than 1° from a (0001) Si plane.

11. A silicon carbide epitaxial wafer comprising:
a silicon carbide substrate having an α-type crystal structure and an off-angle tilted at an angle larger than 0° and less than 4° from a (0001) Si plane; and
an epitaxially grown layer disposed on the silicon carbide substrate,
wherein at a boundary between the silicon carbide substrate and the epitaxially grown layer, 90% or more of a surface of the silicon carbide substrate is occupied by a step bunching region comprising bunched steps of 1 nm unit height for each step and total step height from 5 nm to 10 nm.

12. The silicon carbide epitaxial wafer according to claim 11, wherein a surface roughness of the epitaxially grown layer is more than 0 nm and 0.1 nm or less.

13. The silicon carbide epitaxial wafer according to claim 11, wherein a stacking fault density of a different polytype is more than 0/cm² and 0.2/cm² or less.

14. The silicon carbide epitaxial wafer according to claim 11, wherein the off-angle of the silicon carbide substrate is larger than 0° and 1° or less from a (0001) Si plane.

15. The silicon carbide epitaxial wafer according to claim 1, wherein the epitaxially grown layer substantially has an α-type crystal structure.

16. The silicon carbide epitaxial wafer according to claim 2, wherein the epitaxially grown layer substantially has an α-type crystal structure.

17. The silicon carbide epitaxial wafer according to claim 11, wherein the epitaxially grown layer substantially has an α-type crystal structure.

18. The silicon carbide epitaxial wafer according to claim 1, wherein the epitaxially grown layer substantially has a 4H-type crystal structure, and the silicon carbide substrate substantially has a 4H-type crystal structure.

19. The silicon carbide epitaxial wafer according to claim 2, wherein the epitaxially grown layer substantially has a 4H-type crystal structure, and the silicon carbide substrate substantially has a 4H-type crystal structure.

20. The silicon carbide epitaxial wafer according to claim 11, wherein the epitaxially grown layer substantially has a 4H-type crystal structure, and the silicon carbide substrate substantially has a 4H-type crystal structure.

* * * * *